(12) United States Patent
De Brabander et al.

(10) Patent No.: US 8,628,677 B2
(45) Date of Patent: Jan. 14, 2014

(54) FORMING CURVED FEATURES USING A SHADOW MASK

(75) Inventors: Gregory De Brabander, San Jose, CA (US); Mark Nepomnishy, San Jose, CA (US)

(73) Assignee: FUJIFILM Corporation, Tokyo (JP)

( * ) Notice: Subject to any disclaimer, the term of this patent is extended or adjusted under 35 U.S.C. 154(b) by 278 days.

(21) Appl. No.: 13/077,531

(22) Filed: Mar. 31, 2011

(65) Prior Publication Data

US 2012/0252221 A1    Oct. 4, 2012

(51) Int. Cl.
*C03C 15/00* (2006.01)
(52) U.S. Cl.
USPC .......................................................... 216/72
(58) Field of Classification Search
None
See application file for complete search history.

(56) References Cited

U.S. PATENT DOCUMENTS

| | | | |
|---|---|---|---|
| 4,322,877 A | 4/1982 | Taylor | |
| 4,487,653 A * | 12/1984 | Hatcher | 438/492 |
| 5,154,797 A | 10/1992 | Blomquist et al. | |
| 6,937,736 B2 | 8/2005 | Toda | |
| 7,183,043 B2 | 2/2007 | Meijer et al. | |
| 7,204,586 B2 | 4/2007 | Hoisington et al. | |
| 7,749,868 B2 | 7/2010 | Honda et al. | |
| 2003/0068580 A1 | 4/2003 | Lin | |
| 2003/0178390 A1 * | 9/2003 | Odor et al. | 216/84 |
| 2006/0148241 A1 * | 7/2006 | Brody et al. | 438/637 |
| 2008/0020573 A1 | 1/2008 | Birkmeyer et al. | |
| 2009/0032880 A1 * | 2/2009 | Kawaguchi et al. | 257/369 |

OTHER PUBLICATIONS

Peake et al., "A Micromachined, Shadow-Mask Technology for the OMVPE Fabrication of Integrated Optical Structures," J. Electronic Materials 29(1): 86-90 (2000).

* cited by examiner

*Primary Examiner* — Duy Deo
*Assistant Examiner* — Bradford Gates
(74) *Attorney, Agent, or Firm* — Fish & Richardson P.C.

(57) ABSTRACT

Processes for making a profile-transferring substrate surface and membranes having curved features are disclosed. A profile-transferring substrate surface having a curved feature is created by isotropic plasma etching through a shadow mask. The shadow mask has a through hole which has a lower portion adjacent to the bottom surface of the shadow mask and an upper portion that is above and narrower than the lower portion. The isotropic plasma etching through the shadow mask can create a curved dent in a planar substrate in a central portion of an area enclosed by the bottom opening. After the shadow mask is removed. A uniform layer of material deposited over the exposed surface of the substrate will include a curved feature at the location of the curved dent in the substrate surface.

20 Claims, 3 Drawing Sheets

FORMING CURVED FEATURES USING A SHADOW MASK

TECHNICAL FIELD

This specification relates to fabrication of MEMS devices.

BACKGROUND

Many MEMS devices include piezoelectric actuators that deflect under applied electric voltages. Examples of such devices include fluid ejection systems that eject fluid in response to the actuation of a piezoelectric actuator connected to a fluid path. A printhead module in an ink jet printer is an example of a fluid ejection system. A printhead module typically has a line or an array of nozzles with a corresponding array of ink paths and associated actuators, and drop ejection from each nozzle can be independently controlled by one or more controllers.

A printhead module can include a semiconductor printhead die that is etched to define a fluid flow path that includes a pumping chamber. A piezoelectric actuator can be formed on one side of the pumping chamber, and in operation, the piezoelectric actuator can flex in response to a driving voltage signal to drive fluid along the ink path. The piezoelectric actuator includes a layer of piezoelectric material that changes geometry (i.e., actuates) in response to the driving voltage applied across the piezoelectric layer by a pair of opposing electrodes.

A piezoelectric element that is curved, such as a dome-shaped or dent-shaped piezoelectric membrane, can produce a larger displacement under a given driving voltage as compared to a flat piezoelectric element of similar lateral dimensions. Since the magnitude of the piezoelectric displacement affects the driving voltage that is required to eject fluid droplets of a desired drop volume, and hence, affects the power efficiency of the printhead module, piezoelectric actuators having curved piezoelectric membranes have been proposed. Various fabrication methods have been proposed to produce piezoelectric membranes that are curved or have curved features.

SUMMARY

This specification describes technologies related to MEMS fabrication processes for producing a substrate surface and membranes having curved features.

When a thin layer of material is uniformly deposited on a profile-transferring substrate surface, the layer of material assumes a shape that conforms to the profile of the profile-transferring substrate surface. To form a membrane having curved features (e.g., a piezoelectric membrane having an array of concave recesses or dents formed therein), a profile-transferring substrate surface having curved surface features (e.g., an array of concave recesses or dents) is first prepared. A shadow mask having through-holes formed therein is used in an isotropic etching process for etching recesses in a substrate surface. The through-holes in the shadow mask each includes a constricted portion above a widened bottom opening. The constricted portion partially blocks the impinging plasma over the peripheral portion of the substrate area enclosed by the bottom opening of each through-hole, such that a recess with a concave profile can be formed in the central portion of the area enclosed by the bottom opening of the through-hole.

In general, in one aspect, a process for forming dents in a substrate includes the actions of attaching a bottom surface of a shadow mask to a top surface of the substrate, the shadow mask including a plurality of through-holes, each through-hole leading from a top surface of the shadow mask to the bottom surface of the shadow mask and having a respective lower portion adjacent to the bottom surface and a respective upper portion closer to the top surface of the shadow mask than the respective lower portion, the respective lower portion of the through-hole having a respective bottom opening in the bottom surface of the shadow mask, and a vertical projection of the respective upper portion of the through-hole on the bottom surface of the shadow mask falling entirely within the respective bottom opening of the through-hole; exposing the top surface of the substrate to isotropic plasma etching through the through-holes of the shadow mask; and removing the shadow mask after the dents have been formed to a pre-determined size in the top surface of the substrate.

In some implementations, the respective upper and lower portions of each through-hole are co-axial cylindrical holes.

In some implementations, the respective upper portion of each through-hole is adjacent to the top surface.

In some implementations, attaching the bottom surface of the shadow mask to the top surface of the substrate further includes: applying an RCA 1 cleaning solution to the bottom surface of the shadow mask and the top surface of the substrate; and after the applying, pressing the bottom surface of the shadow mask against the top surface of the substrate to form a temporary bond.

In some implementations, the method further includes reusing the shadow mask for forming dents in a second substrate.

In some implementations, the shadow mask has a total thickness between 50-700 microns.

In some implementations, the vertical projection has a width between 10-300 microns.

In some implementations, for each through-hole, a ratio between a width of the vertical projection and a depth of the through-hole is between 1:30 to 1:50.

In some implementations, for each through-hole, the respective bottom opening of the through-hole has a width three-times larger than a width of the vertical projection of the respective upper portion of the through-hole.

In some implementations, a mixture of CF4, CHF3, and He is used to plasma-etch the substrate.

In some implementations, a mixture of SF6 and Ar or He is used to plasma-etch the substrate.

In some implementations, the method further includes: estimating an etch rate associated with the isotropic plasma etching in the substrate; and stopping the isotropic plasma etching after a time period determine based on the etch rate.

In some implementations, the method further includes polishing the top surface of the substrate after removal of the shadow mask.

In some implementations, the method further includes: prior to the attaching, forming a protective layer over exposed surfaces of the shadow mask to protect the shadow mask from being altered during the isotropic plasma etching.

In some implementations, forming the protective layer over the exposed surfaces of the shadow mask further includes: oxidizing the exposed surfaces of the shadow mask to form an oxide layer.

In some implementations, the shadow mask is made of silicon, glass, aluminum, or graphite.

In some implementations, attaching the bottom surface of the shadow mask to the top surface of the substrate further includes: aligning the plurality of through-holes relative to predetermined positions on the top surface of the substrate;

and pressing the bottom surface of the shadow mask to the top surface of the substrate to form a temporary bond.

In some implementations, removing the shadow mask after the dents have been formed to a predetermined size further includes: separating the shadow mask from the substrate without damaging the shadow mask or the substrate.

In some implementations, attaching the bottom surface of the shadow mask to the top surface of the substrate further includes: annealing the temporary bond to form a permanent bond between the bottom surface of the shadow mask to the top surface of the substrate.

In some implementations, removing the shadow mask after the dents of a predetermined size have been formed further includes: gradually removing materials of the shadow mask to re-expose the top surface of the substrate.

Particular implementations of the subject matter described in this specification can be implemented to realize one or more of the following advantages.

A profile-transferring substrate surface having curved surface features can be formed via a series of MEMS fabrication processes. The sizes, shapes, and locations of the curved features formed in the profile-transferring substrate surface are uniform and controllable. In addition, the densities of the curved features in a profile-transferring substrate surface can be higher than those achievable by injection molding or mechanical means. By using the profile-transferring substrate surface produced according to the methods disclosed in this specification, membranes of various materials can be formed over the profile-transferring substrate surface, where each membrane assumes curved features conforming to the curved surface features existing in the profile-transferring substrate surface, and the curved features in the membranes also have well controlled sizes, shapes, locations, and high densities.

In addition, the grain structures of a membrane formed by material deposition over the profile-transferring substrate surface, such as a piezoelectric membrane deposited by sputtering, can be more uniform in size, shape, and distribution, and have more uniform alignment than those achievable by injection molding or mechanical means. The more uniform and aligned grain structures can help improve the lifetime of the membrane during repeated actuations.

In addition, micro-defects (e.g., both preexisting micro-defects and those created during etching) can exist near the bottom edges of the through-holes in a mask. These micro-defects can cause irregularities in the substrate surface near the bottom edges of the through-holes. By using a shadow mask to create the dents in the substrate surface, the ill effects of the micro-defects can be reduced as compared to the case where a regular mask with through-holes having a constant width throughout is used. The curved surface features formed using a shadow mask can have smoother edges than the curved surface features formed using a regular mask and undercutting below the bottom edges of the through-holes can be effectively avoided. As a result, the quality and mechanical properties of the membranes subsequently formed over the profile-transferring substrate surface can also be improved.

The processes described in this specification can be used to form a durable, efficient, compact, and high resolution integrated piezoelectric actuator assembly or piezoelectric transducer array that include curved piezoelectric elements.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Many of the layers and features are exaggerated to better show the process steps and results. Like reference numbers and designations in the various drawings indicate like elements.

DETAILED DESCRIPTION

Figure 1A:
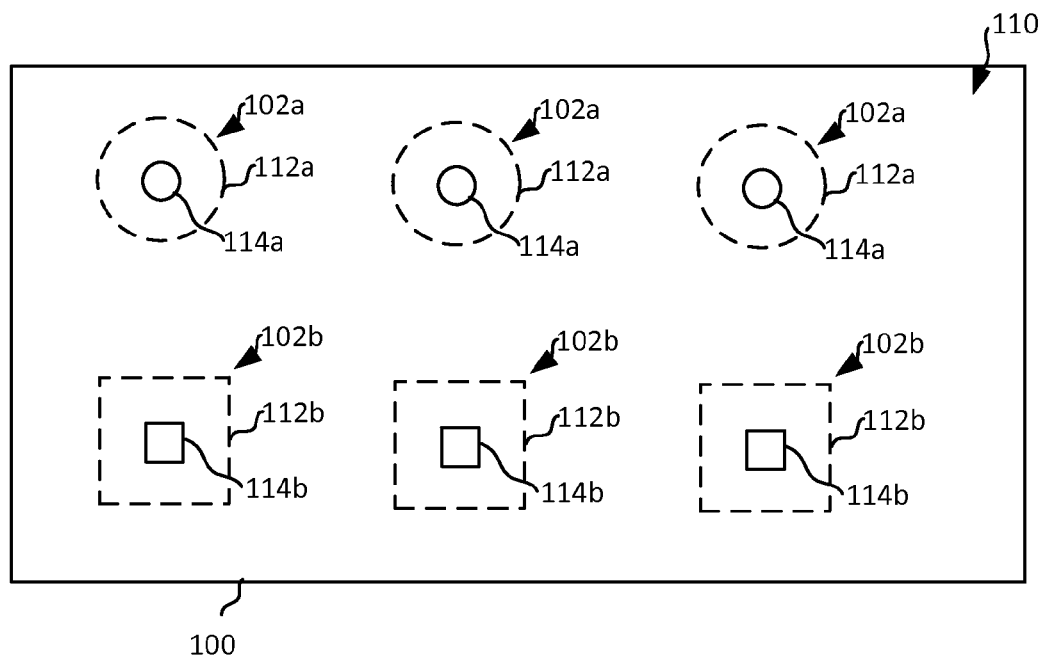
FIGS. 1A-1B illustrate two example designs of a shadow mask.

Fluid droplet ejection can be implemented with a printhead module which includes a die fabricated using MEMS processing techniques. The printhead die includes a substrate in which a plurality of microfabricated fluid flow paths are formed, and a plurality of actuators on the substrate to cause fluid to be selectively ejected from nozzles connected to the flow paths. Each flow path with its associated actuator provides an individually controllable MEMS fluid ejector unit and the plurality of actuators form an actuator assembly.

A MEMS actuator having a curved piezoelectric membrane can be formed using a profile-transferring substrate having a curved surface feature (e.g., a concave recess or dent in a planar substrate surface). Accordingly, an actuator assembly having an actuator array can be formed using a profile-transferring substrate having an array of curved surface features (e.g., an array of concave recesses or dents in a planar substrate surface). The piezoelectric material used for the piezoelectric actuator is deposited (e.g., sputtered) over at least the curved portions of the profile-transferring substrate surface (e.g., on top of a conductive electrode layer deposited on the profile-transferring substrate surface) before the profile-transferring substrate is removed (e.g., at least in part) from at least below the curved portions of the piezoelectric membrane.

Without being limited to any particular theories, the resulting curved piezoelectric membrane can includes grain structures that are columnar and aligned in both the curved portions and any planar portions surrounding the curved portions, and all or substantially all of the columnar grains are locally perpendicular to the surface of the piezoelectric membrane. The aligned grain structure of the curved piezoelectric membrane are more durable and can better withstand the internal stresses caused during actuation, thus leading to better lifetime of the MEMS devices produced using the curved piezoelectric membrane.

Different processes may be used to form curved features on a profile-transferring substrate surface. As described in this specification, a shadow mask is used in an isotropic dry etching process (e.g., isotropic plasma etching) to create curved surface features (e.g., concave recesses or dents) in a planar substrate surface. The substrate surface including the curved surface features can then be used as the profile-transferring substrate surface to create membranes having curved features that conform to the curved surface features of the profile-transferring substrate surface.

A shadow mask is a planar substrate having one or more through-holes formed therein. Each through-hole includes a lower portion adjacent to the bottom surface of the shadow mask and an upper portion closer to the top surface of the shadow mask than the lower portion. The upper portion of each through-hole includes the narrowest portion of the through-hole and is narrower than the lower portion of the through-hole. The upper portion of the through-hole (e.g., the narrowest portion of the through-hole, in particular) has a vertical projection on the bottom surface of the shadow mask entirely within (e.g., occupying a central portion of) the bottom opening of the lower portion (i.e., also the bottom opening of the through-hole). In other words, the materials of the shadow mask that surrounds the upper portion of the through-hole partially shields the substrate surface placed below shadow mask from plasma or other types of irradiations impinging from above, in the peripheral portion of the area enclosed by the bottom opening and around the vertical projection of the upper portion on the substrate surface enclosed by the bottom opening. As used in this specification, the vertical projection of an opening (or a portion of a through-hole) on a planar surface is defined as an area on the planar surface that is directly below the opening (or the portion of the through-hole) in the direction perpendicular to the planar surface, and is not obstructed by materials outside the edge of the opening (or sidewalls of the portion of the through-hole).

To form a profile-transferring substrate from a planar substrate, the substrate's planar surface is exposed to isotropic plasma etching through the through-holes of the shadow mask. Since the mask material around the upper portion of each through-hole partially shields the peripheral portion of the bottom opening of the through-hole, the substrate surface below the peripheral portion of the bottom opening has a reduced level of exposure to the impinging plasma than the substrate surface below the central portion of the bottom opening. In addition, the etch rate in the peripheral portion of the bottom opening decreases with increasing distance from the central portion of the bottom opening.

A curved surface feature (i.e., a concave recess or dent) can be formed in the planar substrate surface at the location of each through-hole in the shadow mask by the impinging and subsequently scattered plasma. The depth and size of the curved features formed depend on, for example, the size and shape of the upper portion of each through-hole, the ratio between the width of the upper portion and the thickness of the shadow mask, a ratio between the width of the upper portion and the width of the lower portion, as well as the etch time and etch rate. After a desired size and depth of the dents are reached, the etching can be stopped. A profile-transferring substrate surface having curved surface features (e.g., the dents) is thus formed.

Additional layers of materials can be deposited over the profile-transferring substrate surface after the shadow mask is removed from the profile-transferring substrate surface. Each layer of additional material will have curved features that conform to the profile of the profile-transferring substrate surface. The profile-transferring substrate surface can be partially (e.g., below the curved features of the additional layers) or completely removed after at least one additional layer of material has been deposited over the profile-transferring substrate surface.

Figure 1B:
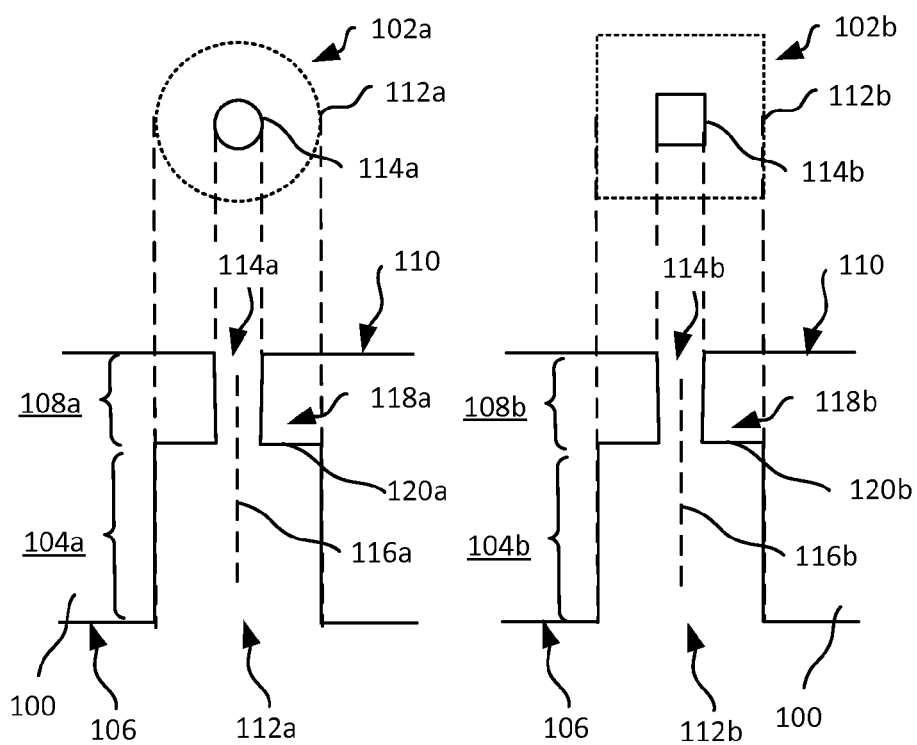

FIGS. 1A-1B illustrate two example designs of a shadow mask 100 that can be used to create curved surface features in a planar substrate (e.g., a semiconductor substrate). FIG. 1A shows a top view of an example shadow mask 100 having through-holes 102 made according to the two example designs. FIG. 1B shows a vertical cross-section of the example shadow mask 100 that bisects a pair of through-holes 102 in the example shadow mask 100. Although the example shadow mask 100 shows a plurality of through-holes 102 with two different designs, a shadow mask in actual use can include a plurality of through-holes of the same design, e.g., every through-hole can use the same design.

In the example shadow mask 100, each through-hole 102 includes a lower portion 104 adjacent to the bottom surface 106 of the shadow mask 100, and an upper portion 108 that is closer to the top surface 110 of the shadow mask 100 than the lower portion 104. The upper portion 108 of each through-hole 102 includes the narrowest portion of the through-hole 102, and is narrower than the lower portion 104 of the through-hole 102. The vertical projection of the upper portion 108 on the bottom surface 106 of the shadow mask 100 falls entirely within (e.g., in the central portion of) the area enclosed by the bottom opening 112 of the lower portion 104. The bottom opening 112 of the lower portion 104 is also the bottom opening of the through-hole 102. The vertical projection of the upper portion 108 on the bottom surface 106 is identical in size and shape as the narrowest portion of the through-hole 102. The mask material around the upper portion 108 of the through-hole 102 (e.g., the mask material around the narrowest portion of the through-hole 102, in particular) partially shields (e.g., when the mask is irradiated with light or plasma from above) the peripheral portion of the area enclosed by the bottom opening 112 of the through-hole 102, i.e., around the vertical projection of the upper portion 108.

In FIGS. 1A-1B, two example lateral shapes (e.g., circular and square) of the narrowest portion of the through-hole 102 and of the bottom opening 112 of the through-hole 102 are shown. However, through-holes having other lateral shapes, e.g., oval or rectangular, are possible. In addition, although it is not necessary that that narrowest portion of the through-hole 102 be at the top of the through-hole 102 or that the upper portion 108 be the upmost portion of the through-hole 102, for illustrative simplicity, in the example designs shown in FIGS. 1A-1B, the upper portion 108 of the through-hole 102 is shown as the topmost portion of the through-hole 102, and the top opening of the upper portion 108 represents the narrowest portion of the through-hole 102. In various implementations, it is possible that the top opening of the upper portion 108 is among other equally narrow portions in the upper portion 108 (e.g., as in an upper portion that is a right cylinder or right prism in shape).

As shown in FIG. 1A, the narrowest portion of the through-hole 102 (e.g., as represented by the top opening 114 of the through-hole 102) and the bottom opening 112 of the through hole 102 are geometrically similar in shape. The narrowest portion of the through-hole 102 is smaller than the bottom opening 112 of the through-hole 102, and is aligned in position and orientation in the vertical direction (i.e., the direction perpendicular to the top and bottom surfaces of the shadow mask 100) with the bottom opening 112 of the through-hole 102. Therefore, the vertical projection of the narrowest portion of the through-hole 102 on the bottom surface 106 of the shadow mask 100 is located at the center portion of the bottom opening 112, and its shape has the same orientation as the shape of the bottom opening 112.

In the first example design, a through-hole 102 (e.g., 102a) includes a top opening 114 (e.g., 114a) and a bottom opening 112 (e.g., 112a) that are both circular in shape. The narrowest portion of the upper portion 108 (e.g., as represented by the top opening 114a) is aligned with the bottom opening 112 (e.g., 112a) in the vertical direction (i.e., the direction perpendicular to the planes of the bottom surface 106 of the shadow mask 100). A vertical projection cast by the narrowest portion of the through-hole 102a on the bottom surface 106 of the shadow mask 100 is concentric with and smaller than the bottom opening 112 of the through-hole 102.

In another example design, a through-hole 102 (e.g., 102b) includes a top opening (e.g., 114b) and a bottom opening 112 (e.g., 112b) that are both square in shape. The narrowest portion of the through-hole 102 (e.g., as represented by the top opening 114b) is aligned with the bottom opening 112 (e.g., 112b) of the through-hole 102 in the vertical direction. A vertical projection cast by the narrowest portion of the through-hole 102 on the bottom surface 106 of the shadow mask 100 has overlapping geometric centers with the bottom opening 112, and is smaller than the bottom opening 112.

In various implementations, the narrowest portion of the through-hole 102 and the bottom opening 112 of the through-hole 102 can have other shapes, such as ellipses, rectangles, polygons, and so on. For example, a through-hole (not shown) can have a hexagonal bottom opening and a smaller, hexagonal top opening that is aligned in both position and orientation with the bottom opening along the vertical direction.

The top view of the shadow mask 100 shown in FIG. 1A is also indicative of the relative widths of the upper and lower portions of each through-holes 102, and the respective transition (e.g., smooth or abrupt) between the upper portion and the lower portion at their interfaces.

For example, the example through-holes 102a and 102b shown in FIG. 1A correspond to a through-hole design in which the upper portion and the lower portion of the through-hole are both uniform in width, and the transition between the upper portion and the lower portion is abrupt (i.e., when the upper portion and the lower portion are connected by a horizontal surface). In some implementations, the upper portion and/or the lower portion can be tapered (e.g., having gradually increasing width going toward the bottom surface of the shadow mask). In some implementations, if both portions are tapered, the tapering in the upper portion and the lower portion may have the same or different slopes. In some implementations, the transition between the upper portion and the lower portion can be continuous (e.g., when the lower opening of the upper portion and the upper opening of the lower portion have identical shapes and sizes).

The geometric shape of the narrowest portion of the through-hole 102 and of the bottom opening 112 of the through-hole 102 can be chosen based on a desired lateral shape of the curved features that are to be formed in a profile-transferring substrate surface. For example, a smaller circular top opening (e.g., representing the narrowest portion of the through-hole) with a larger circular bottom opening for the through-hole of the shadow mask can be used to create a dent that has a circular opening. Similarly, a smaller square top opening (e.g., representing the narrowest portion of the through-hole) with a larger square bottom opening for the through-hole of the shadow mask can be used to create a dent that has a square opening.

The lateral dimensions (e.g., the width or diameter) of the narrowest portion of the through-hole 102 should be slightly smaller than the lateral dimensions of the curved feature that is desired in a profile-transferring substrate surface. Adjustments to the lateral dimensions of the narrowest portion of the through-hole 102 can be made according to the desired depth of curved features to be formed in the profile-transferring substrate, as the curved features will grow in the lateral dimensions as they grow in depth. Therefore, a larger depth for the curved feature may require a reduction to the width of the narrowest portion of the through-hole.

In general, the dimensions of the bottom opening 112 of the through-hole 102 have less impact on the size of the curved feature than the narrowest portion of the through-hole 102 does. In some implementations, the bottom opening 112 of the through-hole 102 can have a width a few times (e.g., three times) the width of the narrowest portion of the through-hole 102.

The respective locations and overall layout of through-holes 102 in the shadow mask 100 are chosen based on the desired locations and overall layout of the curved surface features (e.g., dents) to be formed on the profile-transferring substrate surface. For example, if a profile-transferring substrate surface having a rectangular array of curved features is needed, a rectangular array of through-holes 102 should be formed in shadow mask 100. If a certain offset should exist between each row of curved features in the rectangular array, such offset should also exist between each row of through-holes 102 in the shadow mask 100.

FIG. 1B shows vertical cross-sections of the shadow mask 100 according the two example designs of the through-holes 102 shown in FIG. 1A. Each vertical cross-section is located in a plane that bisects a through-hole 102 in the shadow mask 100 into two equal halves. The cross-sectional shape of each through-hole 102 in the bisecting plane has a respective axis of symmetry 116 that is perpendicular to the bottom surface 106 of the shadow mask 100. The axis of symmetry 116 of a through-hole 102 is also perpendicular to the plane containing the narrowest portion of the through-hole 102, such as the top surface 110 of the shadow mask 100.

In the first example design, the top and bottom openings of the through-hole 102 are circular (e.g., in the case of through-holes 102a), and the upper portion 108a and the lower portion 104a are right cylindrical holes that share a common axis of symmetry 116a. In the second example design, the top and bottom openings of the through-hole 102 are square (e.g., in the case of through-holes 102b), the upper portion 108b and the lower portion 104b are right prism holes with square bases, and the right prism holes share a common axis of symmetry 116b. In other example designs (not shown) where the top and bottom openings of the through-holes are other polygonal shapes (e.g., hexagon), the upper portion and the lower portion can be right prism holes with polygonal-shaped bases (e.g., hexagonal bases), and the right prismatic holes share a common axis of symmetry.

As shown in FIG. 1B, the through-holes 102a and 102b each has sidewalls that are perpendicular to the top surface 110 and the bottom surface 106 of the shadow mask 100, and that the upper portion 108a and 108b and the lower portion 104a and 104b each has uniform width along the vertical direction.

Because, in each of through-hole 102a and 102b, the upper portion of the through-hole is narrower than the lower portion of the through-hole, a step or overhang (e.g., 118a and 118b, respectively) is formed between the upper portion and the lower portion of the through-hole. The step or overhang 118a and 118b each has a lower surface (e.g., 120a and 120b, respectively) that is parallel to the top surface 110 and the bottom surface 106 of the shadow mask 100. As shown in the through-hole designs in FIG. 1B, the transition between the upper portion 108 and the lower portion 104 of the through-hole 102 is abrupt. In some implementations, an intermediate portion (not shown) may exist between the upper portion 108 and the lower portion 104 of the through-hole 102 as a transitional portion between the upper portion 108 and the lower portion 104. The intermediate portion may provide a surface that slopes from the bottom edge of the upper portion 108 to the top edge of the bottom portion 104, for example.

As shown in FIG. 1B, the overhang 118 created due to the difference in width between the upper portion 108 and the lower portion 104 partially shields the peripheral portion of the area enclosed within the bottom opening 112. When a surface of a planar substrate is placed in contact with the bottom surface 106 of the shadow mask 100 and exposed to vertically impinging plasma etching through the bottom opening 112 of the shadow mask 100, the partially shielded area on the substrate surface is only exposed to a reduced amount of etching (e.g., etching caused by plasma etchant that passes through the upper portion 108 at a non-zero incidence angle, or that scatters or diffuses as it passes through the opening 102) compared to the area below the central portion of the bottom opening 112 where the plasma or other dry etchant is impinging directly without any blockage.

Without being limited to any particular theories, isotropic plasma etching through a shadow mask can produce curved surface features with smoother edges as compared to the curved features created using a regular mask (i.e., a mask having vertical through-holes that do not vary in shape or size along the vertical direction). Micro-defects, such as imperfections produced during preparation of the mask or damages caused during the plasma etching, often exist around the edges of the through-holes in a mask. These micro-defects can cause irregular etching rates in the substrate surface around the micro-defects, and thus lead to irregular or jagged edges around the curved surface features formed in the substrate surface. By using a shadow mask, the etch rate near the peripheral portions of the area enclosed within the bottom opening of the through-holes is slower than that in the central portion of the area, therefore, the effect of the micro-defects around the edges of the bottom openings of the through-holes can be significantly reduced.

Furthermore, the sidewalls of the through-holes in a mask can scatter etchant or debris toward the substrate surface near the edges of the bottom openings of the through-holes, causing defects (e.g., trenches or other irregularities) near the edges of the curved surface features formed in the substrate surface. By using a shadow mask, such unwanted scattering by the sidewalls of the through-holes (especially in the lower portion of the through-holes) can be reduced as well. In addition, undercutting of the substrate that may occur below the edges of the through-holes of a regular mask can also be effectively avoided when a shadow mask is used instead.

As curved features having jagged or irregular edges can cause defects in subsequent layers of materials deposited over the profile-transferring substrate surface, these defects may cause delamination between the layers of materials, and reduce the durability of the devices formed from those layers. Similarly, a curved feature having an undercut profile (e.g., a concave recess having an expanded midsection) can have high internal stress near the edge of its opening, and can be easily breakable under stress or actuation. Thus, forming the curved surface features in a profile-transferring substrate surface using the shadow mask can help resolve or alleviate these issues.

As described earlier in the specification, the lateral dimensions of the through-holes 102 (e.g., the width of the narrowest portion) can be chosen according to the desired size and depth of the curved surface features to be formed in the profile-transferring substrate surface. As the etching continues through the through-holes 102, the width and depth of the curved surface features grow gradually. When a predetermined width and depth of the curved surface features are reached, the etching can be stopped, and the shadow mask 100 can be removed. The aspect ratio of the width and depth of the curved features can be adjusted by selecting the width of the narrowest portion of the through-hole 102, and the etch strength or etch rate of the plasma etchant.

The example shadow mask 100 shown in FIG. 1B can be created by a using a first patterned photoresist mask and anisotropic etching to make the upper portions (e.g, 108a, or 108b) of the through-holes from the top surface of a planar substrate. Then, the planar substrate is reversed, a second patterned photoresist mask and anisotropic etching can be used to make the lower portions (e.g., 104a, and 104b) of the through-holes from the bottom surface of the planar substrate, until the two portions are joined. Each of the two anisotropic etching processes creates vertical-walled recesses in the planar substrate. The thickness of the planar substrate, the etch depth of each portion of the through-holes can be chosen according to the predetermined dimensions of the through-holes (e.g., width and depth of each portions of the through-holes). Other processes for creating the shadow mask having through-holes with vertical-walled upper and lower portions are possible.

In various implementations, the shadow mask can be made of silicon, glass, aluminum, or graphite, for example. The thickness of the shadow mask 100 is between a few hundred microns (e.g., 100 or 300 microns) to a few thousand microns (e.g., 1000 or 4000 microns). The fabrication method to create the shadow mask can be selected based on the material of the shadow mask and the design (e.g., configuration and dimensions) of the through-holes.

In some implementations, before the shadow mask is used in plasma etching, the shadow mask is coated with a protective coating (e.g., an oxide layer or nitride layer) to prevent attack of the shadow mask during the plasma etching. Alternatively, a protective layer (e.g., an oxide or nitride layer) can be grown on the surface of the shadow mask. The shadow mask can be reused in processing multiple substrates.

The above example designs of the through-holes 102 are merely illustrative and are not exhaustive. In FIGS. 1A-1B, the upper portion 108 and the lower portion 104 of each example through-hole 102 are shown to be adjacent to each other. However, in some implementations, the upper portion 108 of the through-hole 102 does not have to be immediately adjacent to the lower portion 104 of the through-hole 102 and one or more intermediate portions wider than the upper portion 108 but narrower than the lower portion 104 may exist between the upper portion 108 and the lower portion 104. In addition, in FIGS. 1A-1B, the upper portion 108 is shown as the topmost portion of the through-hole 102. However, in some implementations, the upper portion 108 of the through-hole 102 does not have to be adjacent to the top surface 108 of shadow mask 100, and the through-hole 102 may include one or more other portions (not shown) that are wider than the upper portion 108 (or wider than at least the narrowest portion of the upper portion 108) above the upper portion 108.

FIGS. 2A-2D illustrate an example process for forming a profile-transferring substrate surface having curved surface features using a shadow mask and isotropic dry etching (e.g., isotropic plasma etching), and then forming a membrane having curved features based on the curved profile-transferring substrate surface. A shadow mask 202 having one or more through-holes or an array of through-holes, such as those made according to the designs described with respect to FIGS. 1A-1B, can be used. In some implementations, the shadow mask 202 includes a plurality or array of through-holes of the same design.

Figure 2A:
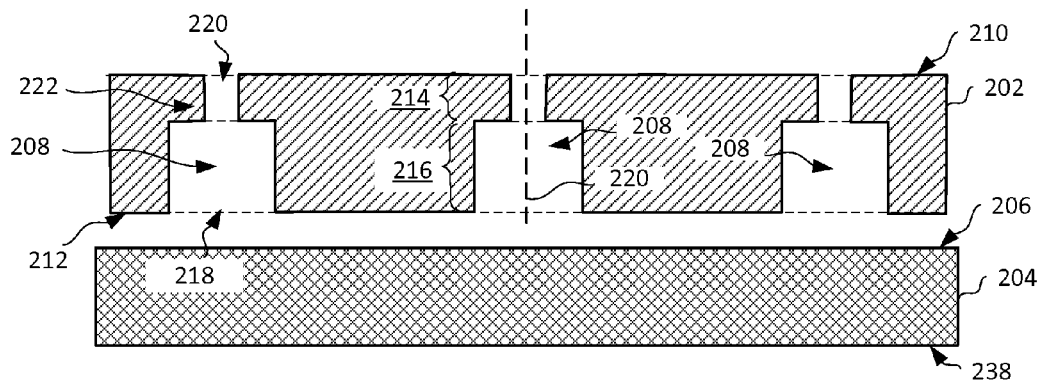
FIGS. 2A-2E illustrate an example process for forming a profile-transferring substrate surface having curved surface features using a shadow mask, and a membrane having curved features using the profile-transferring substrate surface.

First, as shown in FIG. 2A, a shadow mask 202 is placed over a planar substrate 204. The planar substrate 204 has an upper surface 206 in which curved surface features (e.g., concave-shaped recesses) will be created.

As shown in FIG. 2A, the shadow mask 202 has a plurality of through holes 208 formed therein from the top surface 210 of the shadow mask 202 to the bottom surface 212 of the shadow mask 202. Each through-hole 208 has an upper portion 214 and a lower portion 216. The upper portion 214 includes the narrowest portion of the through-hole 208. The narrowest portion of each through-hole 208 is narrower than (e.g., ⅓ the width of) the bottom opening 218 of the through-hole 208 (i.e., the bottom opening of the lower portion 216 of the through-hole 208).

The narrowest portion (e.g., the top opening 220) of the through-hole 208 has a vertical projection on the bottom surface 212 of the shadow mask 202 entirely within the bottom opening 218 of the through-hole 208 (e.g., in the central portion of the area enclosed by the bottom opening 218). The overhang 222 created by the mask material above the bottom opening 218 of the through-hole 208 partially shields the peripheral portion of area enclosed by the bottom opening 218, immediately surrounding the vertical projection of the narrowest portion (e.g., the top opening 220) of the through-hole 208.

To temporarily bond the bottom surface 212 of the shadow mask 208 to the planar top surface 206 of the substrate 204, the bottom surface 212 of the shadow mask 202 and the top surface 206 of the substrate 204 (e.g., a silicon substrate) can be cleaned, e.g., by applying an RCA 1 solution to the surfaces, to activate the bonding surfaces.

Then, the bottom surface 212 of the shadow mask 202 and the top surface 206 of the substrate 204 are pressed against each other to form the temporary bond between the two surfaces. Before the bonding, the through-holes 208 can be aligned with locations on the surface of the substrate 204, e.g., according to alignment marks on the top surface 206 of the substrate 204.

After the bottom surface 212 of the shadow mask 202 is temporarily bonded to the upper surface 206 of the substrate 204, the upper surface 206 of the substrate 204 can be exposed to plasma etching through the through-holes 208 in the shadow mask 202. In some implementations, the shadow mask 202 and the substrate 204 can be annealed at a high temperatures such that the temporary bonding between their surfaces is made permanent before the plasma etching is started.

Figure 2B:
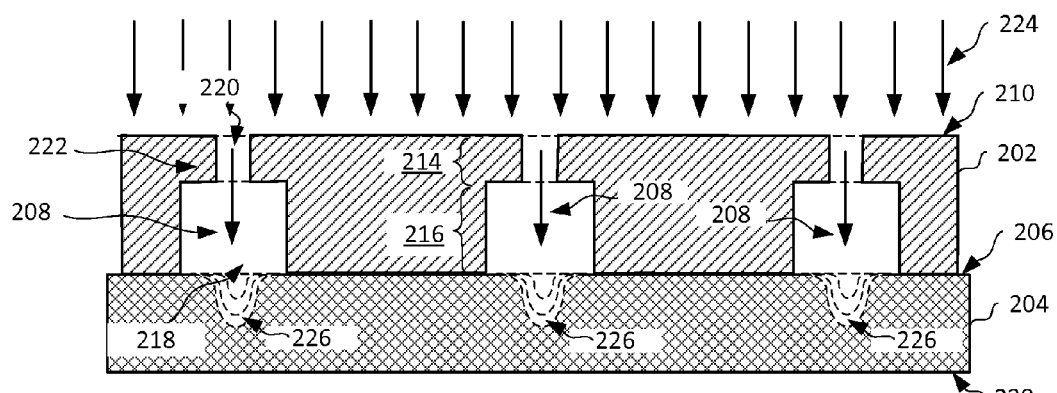

As shown in FIG. 2B, after the bonding (temporary or permanent) between the shadow mask 202 and the substrate 204 is completed, the upper surface 210 of the shadow mask 202 is exposed to an isotropic plasma etchant 224 (e.g., steady streams or pulses of charged ions or neutral particles). The isotropic plasma etchant enters the through-holes 208 from above and reacts with the exposed upper surface 206 of the substrate 204 (i.e., the surface of the substrate within the bottom opening 218 of the through-holes 208), and gradually forming a curved dent 226 in the exposed upper surface 206 of the substrate 204. The volatile byproducts of the reactions can escape from the top opening 220 of the shadow mask 202 during the etching process.

Since the streams or pulses of plasma etchant is directed in a direction substantially perpendicular to the surface 206 of the substrate 204, the etch rate is greatest in the central region of the area enclosed within the bottom opening 218 of the through hole 208, i.e., the area of the substrate surface 206 that is directly below the top opening 220 of the through hole 208. The plasma etchant is at least partially blocked from above by the overhanging portion 222 of the shadow mask 202 above the peripheral portions of the bottom opening 218 of the through-hole 208 and only plasma etchant that passes through the upper portion 108 at a non-zero incidence angle, or that scatters or diffuses as it passes through the opening 102 can reach those peripheral portions. Therefore, the etch rate in the peripheral portions of the area enclosed within the bottom opening 218 is smaller than that in the central portion of the area enclosed within the bottom opening 218.

Example plasma etchants can be a mixture of $CF_4$, $CHF_3$ and He gases, or alternatively, a mixture of $SF_6$ and Ar or He gases. Other mixtures and compositions are possible, depending on the material of the substrate and the desired etch rate.

As shown in FIG. 2B, during the isotropic plasma etching process, the plasma will gradually create a curved recess 226 in the central region of the area within the bottom opening 218 of the shadow mask 202. The curved recess 226 will grow in depth and width as the etching continues. When a desired depth and width of the curved recess is reached, the plasma etching can be stopped. In some implementations, the etch rate can be calibrated in terms of etch time and etch depth and width, such that the etching can be timed and stopped after a predetermined time period that corresponds to the desired depth and width of the curved recess.

The exact profile of the curved recess 226 can be adjusted by adjusting the plasma etchant used in the etching process. A deeper recess with steeper sidewalls can be created with a stronger etchant and faster etch rate. In addition, the width and height of the narrowest portion of the through-hole 208 can be used to adjust the size and depth of the curved recess as well. For example, other conditions being equal, a smaller width and a bigger height for the narrowest portion of the through-hole 208 can lead to a curved recess that is narrower in the lateral dimensions and have a steeper profile in the vertical dimension. In contrast, a larger width and smaller height for the narrowest portion can lead to a curved recess that is wider and have a less steep profile.

In an example implementation, depending on the desired size (e.g., anywhere between a few microns to a few hundred microns) for the curved features in the profile-transferring substrate surface, the width of the narrowest portion of the through-hole can be a few microns wide to a few hundreds of microns wide (e.g., 10 microns to 300 microns wide). The aspect ratio of the narrowest portion of the through-hole to the thickness of the shadow mask can be 1:30 to 1:50. The thickness of the shadow mask can be 50 microns to 700 microns. A thicker shadow mask can have better mechanical properties, and can be removed from a substrate and reused. An additional consideration for choosing the thickness of the upper portion of the shadow mask is that the overhang created above bottom opening should not sag or deform due to its own weight.

Figure 2C:
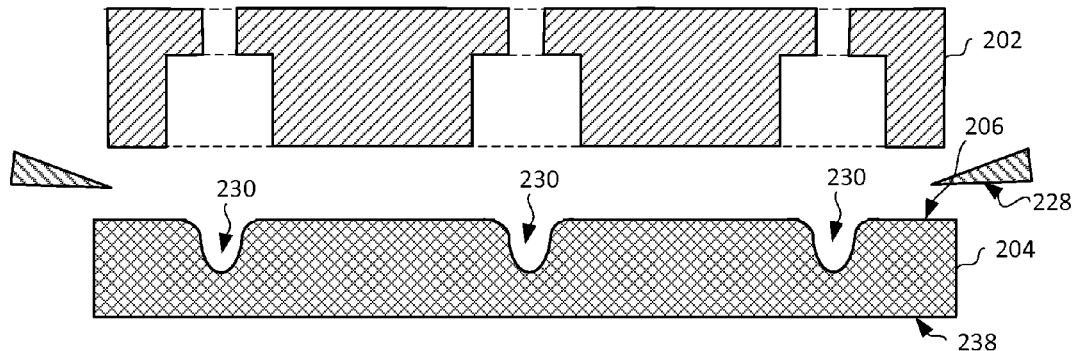

As shown in FIG. 2C, after the desired surface features (e.g., dents 230) are formed in the top surface 206 of the substrate 204, the shadow mask 202 can be removed from the top surface 206 of the substrate 204. If the bonding between the shadow mask 202 and the substrate surface 206 is temporary, the shadow mask 202 can be removed by a pry tool 228 without causing damage to the shadow mask 202. The shadow mask 202 can be reused in the etching process for another substrate. If the bonding between the shadow mask 202 and the substrate 204 is permanent, the shadow mask 202 can be removed by grinding and polishing to expose the top surface 206 of the substrate 204. After the shadow mask 202 is removed, the top surface 206 of the substrate 204 having the curved surface features 230 is exposed.

In some implementations, the exposed top surface 206 can be prepared (e.g., cleaned and polished) for use as a profile-transferring substrate in subsequent processing. In some implementations, a thin protective layer (e.g., an oxide or nitride layer) can be grown on the profile-transferring substrate surface and removed to smoothen it further. Optionally, another protective layer (e.g., an oxide or nitride layer) can be grown or deposited on the smoothed surface of the profile-transferring substrate surface. The top surface 206 of the substrate 204 (with or without the protective layer) can then be used to provide the profile-transferring substrate surface for depositing another layer of material.

Figure 2D:
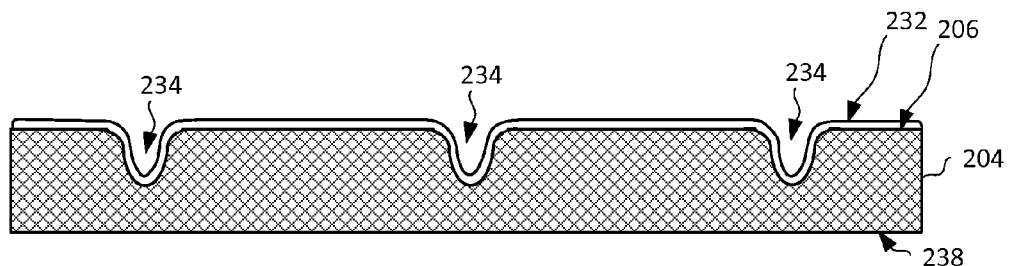

As shown in FIG. 2D, a first layer of material 232 (e.g., a few thousands of Angstroms of Au, Au/W, Ir, Pt, and so on) is uniformly deposited on the exposed top surface 206 of the substrate 204. The layer of material 232 is of uniform thickness and can serve as a bottom electrode layer of a piezoelectric actuator assembly. The first layer of material 232 includes curved portions 234 that conform to the profile-transferring substrate surface provided by top surface 206 of the substrate 204.

Additional layers of materials (not shown in FIG. 2D) can be sequentially deposited over the first layer of material 232, such as a piezoelectric layer, and a top electrode layer. Each additional layer will adopt curved features conforming to the curved features of the layer immediately below. Various suitable methods for depositing the one or more layers of materials can be used. For example, the bottom electrode layer, the piezoelectric layer, and the top electrode layer can each be deposited by sputtering, plasma-enhanced vapor deposition, chemical vapor deposition, or physical vapor deposition, and so on. The different layers of materials can each be patterned before the next layer of material is deposited over it. The different layers can form the piezoelectric actuator assembly of a fluid ejection module or other MEMS devices, such as ultrasonic transducers.

Figure 2E:
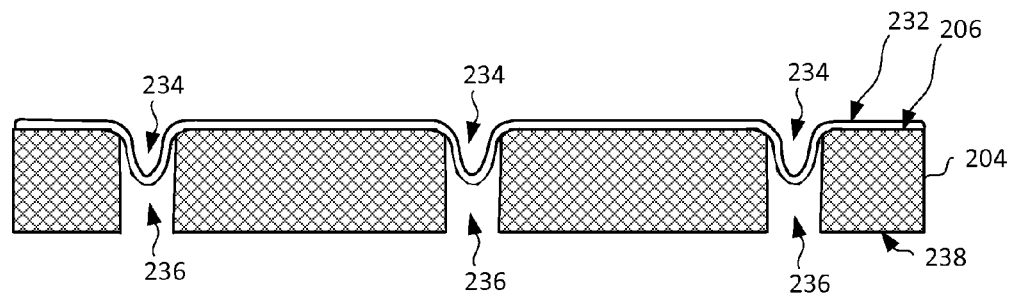

After the layers of materials are deposited over the top surface 206 of the substrate 204, a handle layer (not shown) can be attached to the top surface 206 of the topmost layer (e.g., the layer 232 or another layer deposited over the layer 232). And the substrate 204 can be removed or etched from the bottom side 238. For example, as shown in FIG. 2E, recesses 236 can be etched in the bottom side 238 of the substrate 204 directly below the curved portions 234 of the profile-transferring substrate 204, until the bottom surface of the first layer of materials 232 is exposed in the areas within the sidewalls of the recesses 236. The different layers of materials deposited over the profile-transferring substrate surface are now suspended and free to flex under a driving voltage signal. In some implementations, where a protective layer is deposited or grown between the first layer of material 232 and the profile transferring substrate surface 206 of the substrate 204, the protective layer can serve as an etch stop during the etching on the bottom side 238 of the substrate 204.

FIG. 2E shows the resulting structure after the substrate 204 has been etched away in areas directly below the curved portions 234 of first layer of material 232, and the bottom surface of first layer of material 232 has been exposed within the sidewalls of the recesses 236. Planar portions of substrate 204 remain in areas outside the sidewalls of the recesses 236, i.e., below the planar portions of the first layer of material 232.

Although the example process are shown using a shadow mask having though-holes that have cylindrical upper and lower portions, other shadow masks having lower and upper openings of different shapes and configurations can be used.

Figure 3:
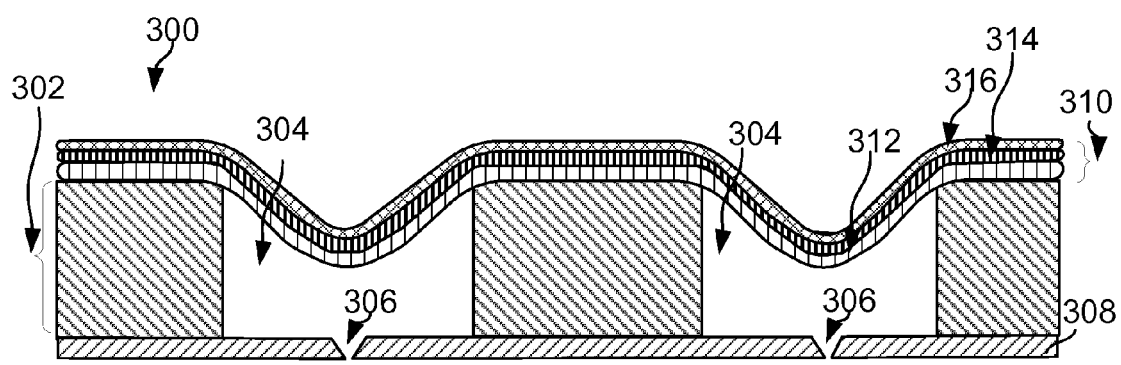
FIG. 3 is a schematic cross-sectional view of a printhead die in an example fluid ejection module having a concave piezoelectric actuator.

FIG. 3 is a schematic of an example fluid ejection system 300 that can be formed at least in part using the process shown in FIG. 2A-2E. As shown in FIG. 3, the substrate 204 having the cavities 236 formed therein, can serve as a pumping chamber layer 302 of the fluid ejection system 300, and the cavities 236 can serve as the pumping chamber cavities 304 for the fluid ejection system 300. The pumping chamber cavities 304 are connected to fluid paths that have been formed in the pumping chamber layer 302 in a different process. Nozzles 306 are formed in a nozzle layer 308, and are connected to the pumping chamber cavities 304. A number of layers that are deposited over the profile-transferring substrate surface can form the piezoelectric actuator assembly 310 above the pumping chamber layer 302. As shown in FIG. 3, the layers include a bottom electrode layer 312, a piezoelectric layer 314, and a top electrode layer 316. Each of these three layers can be patterned to define individual actuator units that include a top electrode, a bottom electrode, and piezoelectric element directly above each pumping chamber cavity 304.

Although examples are described in terms of a process for making a piezoelectric actuator assembly for a fluid ejection system, the process can be used in making other MEMS devices that include membranes having curved features or arrays of curved features.

The use of terminology such as "front," "back," "top," "bottom," "over," "above," and "below" throughout the specification and claims is used to illustrative the relative orientation or position of components of the system. The use of such terminology does not imply a particular orientation of the system in operation. Similarly, the use of any horizontal or vertical terms to describe elements is in relation to the implementation described. In other implementations, the same or similar elements can be oriented other than horizontally or vertically as the case may be.

What is claimed is:

1. A process for forming dents in a substrate, comprising:
   attaching a bottom surface of a shadow mask to a top surface of the substrate,
   the shadow mask including a plurality of through-holes, each through-hole leading from a top surface of the shadow mask to the bottom surface of the shadow mask and having a respective lower portion adjacent to the bottom surface and a respective upper portion closer to the top surface of the shadow mask than the respective lower portion,
   the respective lower portion of the through-hole having a respective bottom opening in the bottom surface of the shadow mask, the respective upper portion of the through-hole having a respective upper opening in the top surface of the shadow mask, and
   a vertical projection of the respective upper opening along a direction perpendicular to the top surface of the shadow mask on the bottom surface of the shadow mask falling entirely within the respective bottom opening without a peripheral of vertical projection overlapping with a peripheral of the respective bottom opening;
   exposing the top surface of the substrate to isotropic plasma etching through the through-holes of the shadow mask to form curved dents in the top surface of the substrate, each curved dent having a width narrower than a width of the respective bottom opening; and
   removing the shadow mask after the curved dents have been formed to a predetermined size in the top surface of the substrate.

2. The process of claim 1, wherein:
   the respective upper and lower portions of each through-hole are co-axial cylindrical holes.

3. The process of claim 2, wherein:
   the respective upper portion of each through-hole is adjacent to the top surface of the shadow mask.

4. The process of claim 1, wherein attaching the bottom surface of the shadow mask to the top surface of the substrate further comprises:

applying an RCA 1 cleaning solution to the bottom surface of the shadow mask and the top surface of the substrate; and after the applying, pressing the bottom surface of the shadow mask against the top surface of the substrate to form a temporary bond.

5. The process of claim 1, further comprising:

reusing the shadow mask for forming dents in a second substrate.

6. The process of claim 1, wherein the shadow mask has a total thickness between 50-700 microns.

7. The process of claim 1, wherein the vertical projection has a width between 10-300 microns.

8. The process of claim 1, wherein, for each through-hole, a ratio between a width of the vertical projection and a depth of the through-hole is between 1:30 to 1:50.

9. The process of claim 1, wherein, for each through-hole, a width of the respective bottom opening of the through-hole is three-times larger than a width of the vertical projection of the respective upper opening of the through-hole.

10. The process of claim 1, wherein a mixture of $CF_4$, $CHF_3$, and He is used to plasma-etch the substrate.

11. The process of claim 1, wherein a mixture of $SF_6$ and Ar or He is used to plasma-etch the substrate.

12. The process of claim 1, further comprising:

estimating an etch rate associated with the isotropic plasma etching in the substrate; and stopping the isotropic plasma etching after a time period determined based on the etch rate.

13. The process of claim 1, further comprising:

polishing the top surface of the substrate after removal of the shadow mask.

14. The process of claim 1, further comprising:

prior to the attaching, forming a protective layer over exposed surfaces of the shadow mask to protect the shadow mask from being altered during the isotropic plasma etching.

15. The process of claim 14, wherein forming the protective layer over the exposed surfaces of the shadow mask further comprises:

oxidizing the exposed surfaces of the shadow mask to form an oxide layer.

16. The process of claim 1, wherein the shadow mask comprises silicon, glass, aluminum, or graphite.

17. The process of claim 1, wherein attaching the bottom surface of the shadow mask to the top surface of the substrate further comprises:

aligning the plurality of through-holes relative to predetermined positions on the top surface of the substrate; and pressing the bottom surface of the shadow mask to the top surface of the substrate to form a temporary bond.

18. The process of claim 17, wherein removing the shadow mask after the curved dents have been formed to a predetermined size further comprises:

separating the shadow mask from the substrate without damaging the shadow mask or the substrate.

19. The process of claim 17, wherein attaching the bottom surface of the shadow mask to the top surface of the substrate further comprises:

annealing the temporary bond to form a permanent bond between the bottom surface of the shadow mask and the top surface of the substrate.

20. The process of claim 18, wherein removing the shadow mask after the curved dents of a predetermined size have been formed further comprises:

gradually removing materials of the shadow mask to re-expose the top surface of the substrate.

* * * * *